United States Patent [19]

Brilman

[11] Patent Number: 4,631,417
[45] Date of Patent: Dec. 23, 1986

[54] ADDRESSABLE PHOTODETECTOR ARRAY

[75] Inventor: Michel Brilman, Bruyeres le Chatel, France

[73] Assignee: Compagnie Industrielle des Telecommunications Cit-Alcatel, Paris, France

[21] Appl. No.: 625,159

[22] Filed: Jun. 27, 1984

[30] Foreign Application Priority Data

Jun. 29, 1983 [FR] France ................. 83 10719

[51] Int. Cl.$^4$ .......................................... H04N 5/335
[52] U.S. Cl. .................................... 250/578; 358/213
[58] Field of Search ................... 250/578; 357/30–32; 358/212, 213

[56] References Cited

U.S. PATENT DOCUMENTS

| 3,465,293 | 9/1969 | Weckler | 357/32 |
| 3,715,485 | 2/1973 | Weimer | 358/213 |
| 4,109,284 | 8/1978 | Tompkins | 358/212 |
| 4,571,624 | 2/1986 | Nishizawa et al. | 250/578 |

FOREIGN PATENT DOCUMENTS 1562037 10/1969 Fed. Rep. of Germany .
2055196 2/1981 United Kingdom .

Primary Examiner—David C. Nelms
Assistant Examiner—S. Allen
Attorney, Agent, or Firm—Sughrue, Mion, Zinn, Macpeak & Seas

[57] ABSTRACT

An addressable photodetector array comprises row addressing lines, column addressing lines, an output line and a biasing line common to all the photodetectors. It further comprises a respective addressing circuit associated with each photodetector. The addressing circuit comprises a first transistor, a second transistor, a first series circuit controlling the second transistor and a second series circuit controlling the first transistor and the first circuit according to a signal on a row addressing line and a signal on a column addressing line.

7 Claims, 10 Drawing Figures

ADDRESSABLE PHOTODETECTOR ARRAY

BACKGROUND OF THE INVENTION

1. Field of the Invention

The invention concerns an addressable photodetector array enabling a subscriber to select one of a number of optical signals each emitted by a separate light source, for example an optical fiber delivering an analog or digital signal, each light source illuminating a photodetector of the array.

2. Description of the Prior Art

Matrix photodetector arrays are already known, in particular from French Pat. Nos. 2 441 309 and 2 445 678. Each row is connected to a common output channel through a transistor which is turned on by a voltage applied to its grid by means of a row select control line, and each photodetector is connected to a row through a transistor; all the transistors assigned to all the photodetectors in the same column have their grid connected to a column control line; a control voltage applied to the column control line thus provides for connecting the photodetector in the column corresponding to the selected line. When the photodetector thus selected receives a light signal, a current flows in the common output channel. In a photodetector array of this kind, the unselected photodetectors cannot conduct away the charges created when they receive an optical signal since the transistors which connect them to the rows are normally turned off except for those of the selected column; it is therefore necessary that the transistors connecting the rows to the common output channel be actually turned off, which requires that their leakage current be zero or very low so as not to transmit the current from the photodetectors of the selected column, or the current from the photodetectors of the other columns if the transistor which connects each of them to a row is not turned off, that is if its leakage current is not zero or very low; in the case of the photodetectors forming part of the selected row, their current would disturb the current from the selected photodetector if the transistor which connects each of them to said row is not turned off.

An objective of the present invention is an addressable photodetector array which does not have the disadvantages of the known array and which can be readily implemented in integrated circuit form.

SUMMARY OF THE INVENTION

The invention consists in a matrix array of addressable photodetectors comprising an output line common to all said photodetectors, a biasing line common to all said photodetectors, row addressing lines, column addressing lines, a ground connection to each photodetector, and a respective addressing circuit associated with each photodetector and comprising first means adapted to connect said photodetector to said output line, second means adapted to connect said photodetector to said biasing line, third means connected to said biasing line and to ground and adapted to control said second means, and fourth means connected to one of said row addressing lines and to one of said column addressing lines and to ground and adapted to control said first and third means, wherein said first, third and fourth means are turned off and said second means are turned on in the absence of signals on said row and column addressing lines, and said first, third and fourth means are turned on and said second means are turned off when signals are applied to said row and column addressing lines to select said photodetector associated with said addressing circuit.

Other objects and advantages will appear from the following description of an example of the invention, when considered in connection with the accompanying drawings, and the novel features will be particularly pointed out in the appended claims.

DESCRIPTION OF THE PREFERRED EMBODIMENTS

Figure 1:
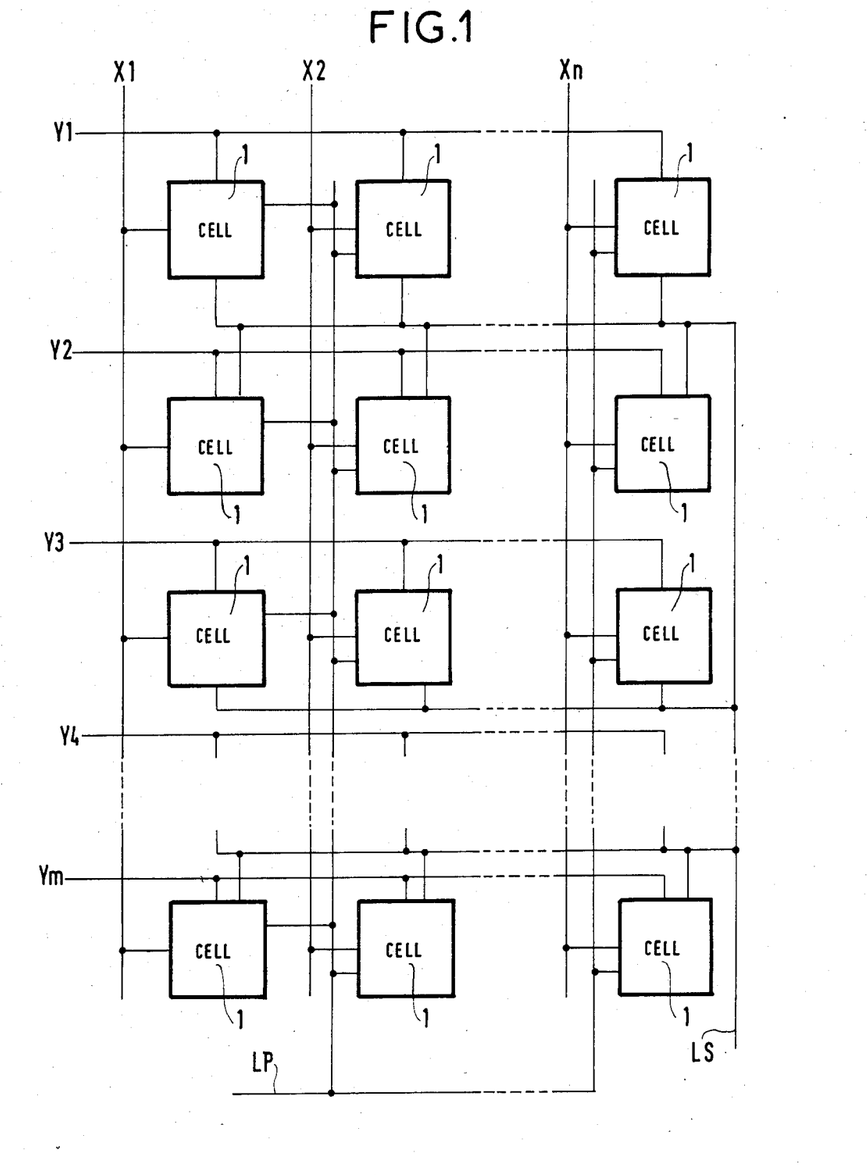
FIG. 1 is a block diagram schematic of an array in accordance with the invention.

FIG. 1 shows a matrix array of photodetectors in accordance with the invention having m rows and n columns and consisting of identical cells 1 each comprising a photodetector in the form of a photodiode and an addressing circuit. The matrix comprises row addressing lines Y1, Y2, . . . Ym, column addressing lines X1, X2, . . . Xn, an output line LS common to all the cells and a biasing line LP common to all the cells. Each cell 1 is thus connected to a row addressing line, to a column addressing line, to the output line and to the biasing line; it is also connected to ground, this connection not being shown in FIG. 1 in order to avoid overcomplicating it. The biasing line LP is connected to a positive potential produced by a DC voltage source, also not shown.

Figure 2:
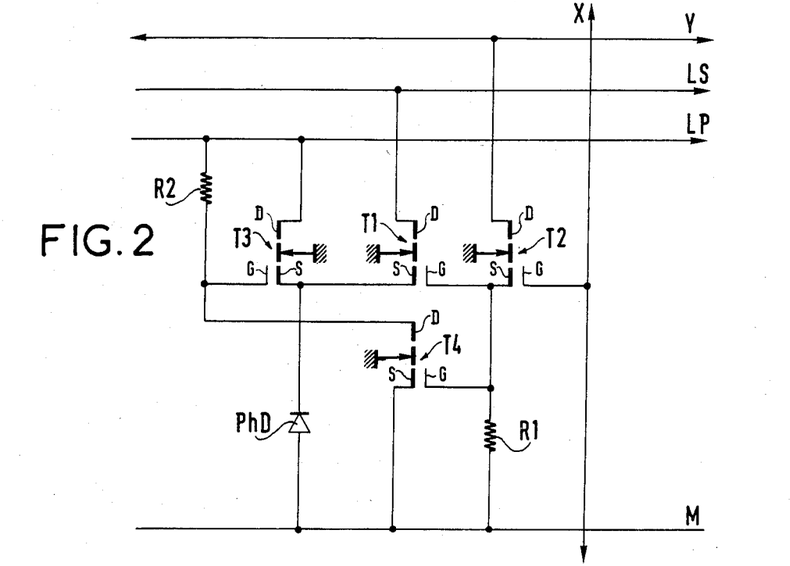
FIG. 2 is a circuit schematic of one cell from the array of FIG. 1.

FIG. 2 shows one embodiment of a cell 1 from FIG. 1. The cell comprises a photodiode PhD and an addressing circuit comprising four N-channel MOS transistors T1, T2, T3 and T4, which are normally turned off, and two resistors R1 and R2. The photodiode PhD is connected on the one hand to the ground line M and on the other hand to the output line LS through the transistor T1 and to the biasing line LP through the transistor T3. Transistor T2 is in series with the resistor R1, the transistor being connected to the row addressing line Y and the resistor being connected to the ground line M; the grid of the transistor T2 is connected to the column addressing line X; a point common to the resistor R1 and the transistor T2 is connected to the grid of the transistor T1. The transistor T4 is in series with the resistor R2, the transistor being connected to the ground line M and the resistor being connected to the biasing line LP; a point common to the resistor R2 and the transistor T4 is connected to the grid of the transistor T3; the grid of the transistor T4 is connected to a point common to the transistor T2 and the resistor R1.

When the cell is not selected, and thus with no signals on the row addressing lines Y and column addressing lines X, the transistors T1, T2 and T4 are turned off and the transistor T3 is turned on; as the photodiode PhD is illuminated current from it flows through the transistor T3 and the biasing line LP connected to a DC voltage source. When the cell is selected by a positive signal on each of the row addressing lines Y and column addressing lines X, the transistor T2 turns on which turns on transistors T1 and T4; as the transistor T4 is turned on the voltage on the grid of the transistor T3 drops to a value close to that on the ground line M which turns off the transistor T3. The current from the photodiode PhD flows through the transistor T1 into the output line LS, this line being connected, for example, to a preamplifier to amplify the current from the photodiode PhD, this current corresponding to the light signal received by the photodiode.

In FIG. 1, when none of the cells is selected there is no current in the output line LS; on the other hand, the current from the photodiode of the cells which receive a light signal flows through the biasing line LP. When a cell is selected, only the current from the photodiode of that cell is carried by the output line LS.

Figure 3:
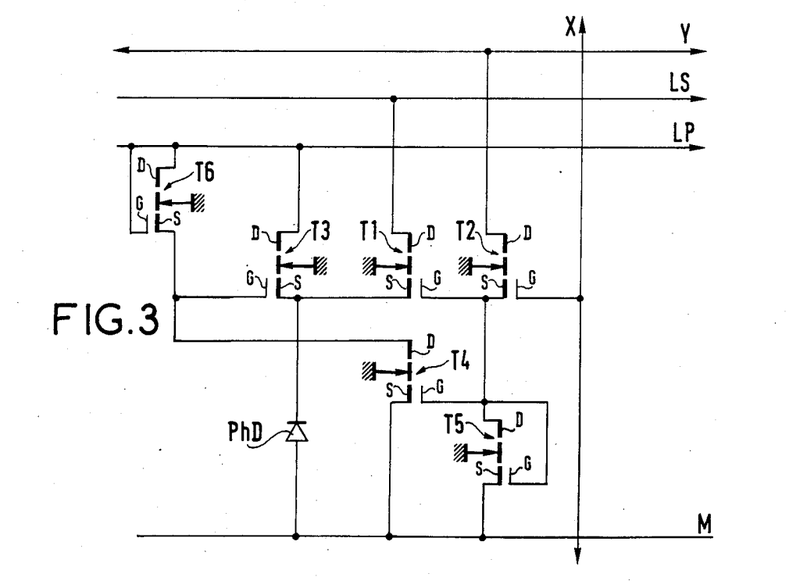
FIG. 3 is an alternative circuit schematic of one cell of the array of FIG. 1.

FIG. 3 shows an alternative embodiment of a cell 1 from FIG. 1. This figure contains the same components in the form of the photodiode PhD and the transistors T1, T2, T3 and T4 as FIG. 2; on the other hand, the resistors R1 and R2 are replaced by respective transistors T5 and T6, also of N-channel MOS type; the transistor T5 is in series with the transistor T2 and its grid is connected to the transistor T2, this transistor T5 being turned on when the transistor T2 is turned on, and then behaving as a resistance; the transistor T6 is in series with the transistor T4 and, since its grid is connected to the biasing line LP, this transistor T6 is always turned on and behaves as a resistance; the operation of this cell is identical to that of the cell in FIG. 2, the photodiode addressing circuit consisting of the transistors T1, T2, T3, T4, T5 and T6.

Figure 4:
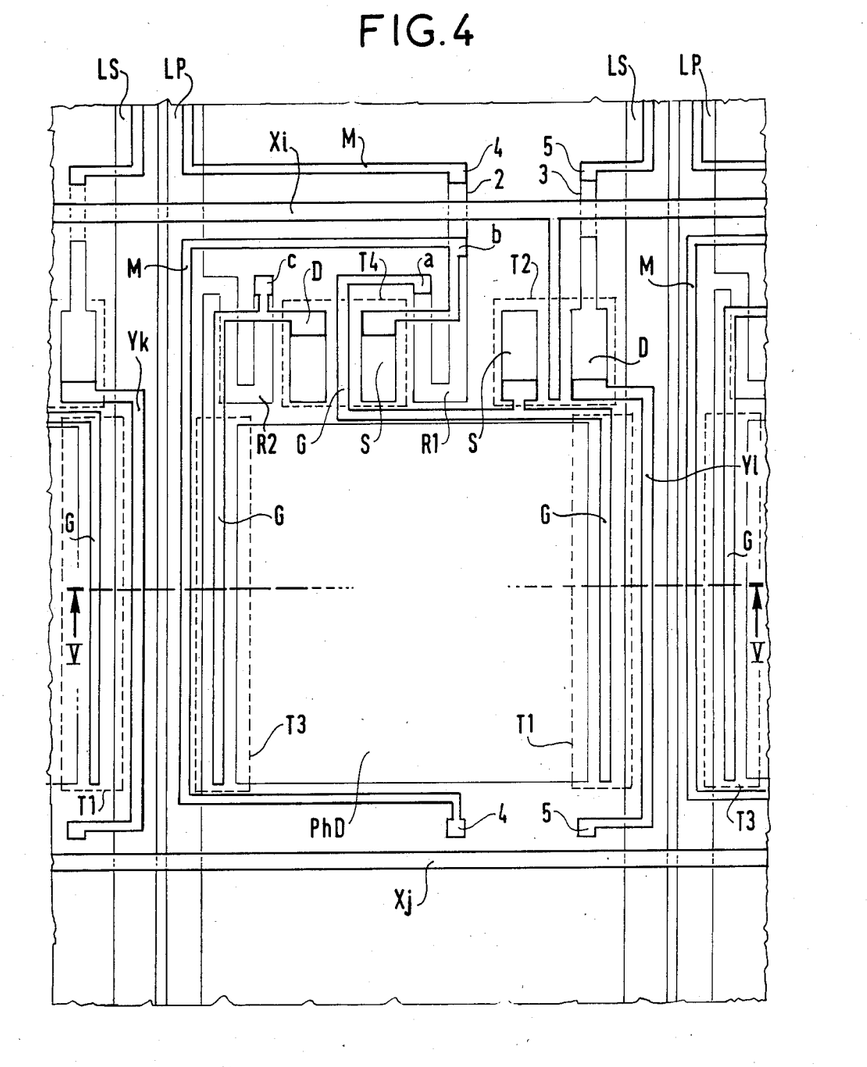
FIG. 4 represents a first integrated circuit implementation of an array with a cell as in FIG. 2.

FIG. 4 shows one example of the implementation in the form of an integrated circuit of an array using the cell from FIG. 2; one cell is shown in FIG. 4, but it will be understood that it is the entire array of photodetectors from FIG. 1 which is implemented in integrated circuit form, the cell shown forming part of this integrated circuit, the arrangement of the cells in which will be explained in the course of the following description.

To fabricate the integrated circuit a wafer of P+ type silicon of low resistivity (15 milliohms/centimeter, for example) is selected. On one side of the wafer is created a P− type layer of high resistivity (10 ohms/centimeter, for example); this layer may be formed epitaxially, for example, with a thickness of the order of 20 microns, for example. An N type layer is formed in areas of the P− layer of the wafer corresponding to the output line LS, the biasing line LP, the photodiodes PhD, the sources S and drains D of the transistors T2 and T4 and the resistors R1 and R2. The resistor R2 is connected to the biasing line LP and to two connections 2 and 3, of which connection 2 extends the resistor R1 to connect it to ground and the connection 3 extends the drain D of the transistor T2 to connect it to the row addressing line Y of the cell.

FIG. 4 shows these N type areas which are obtained in the conventional manner by masking and diffusion.

There is then formed a thin layer of oxide ($SiO_2$) on the surface of the wafer, apart from the areas corresponding to the photodiodes PhD and parts of the sources and drains of the transistors T2 and T4.

Contact access areas are then formed in the N layer and in the P− layer. The N layer access is provided in certain areas which correspond in each cell, and as shown in FIG. 4, to one end 5 of the connection 3, to the ends a and b of the resistor R1, the end b being common to the resistor R1 and to the connection 2, and to one end c of the resistor R2 opposite the biasing line. The P− layer access is formed at a point 4 on the connection 2 situated at the end of the latter opposite the end b.

By depositing a metal which is a good conductor of electricity, such as aluminum, for example, there are then formed the source electrode S and drain electrode D of the transistors T2 and T4 in the oxide-free parts, contacts with the N and P− layers in the contact access openings, and (on the oxide) the grid electrodes of the transistors T1 to T4 and an interconnecting network consisting of the row addressing lines X1 to Xn and the connections of the latter to the grid electrodes of the transistors T2, the row addressing lines Y1 to Ym and the connections of the latter to the drains of the transistors T2 and the ends 5 of the connections 3, the ground line M and the connections of the latter to the ends b of the resistors R1 and the points 4 on the connections 2, and connections internal to each cell, between the component parts of the latter. These internal cnnections comprise: a connection linking the grid electrode of the transistor T1 to the source of the transistor T2 and to the grid electrode of the transistor T4, a connection linking the source of the transistor T4 to the end b of the resistor R1, a connection linking the grid of the transistor T4 to the end a of the resistor R1, and a connection linking the grid electrode of the transistor T3 to the end c of the resistor R2 and to the drain of the transistor T4.

The photodiodes then receive an anti-reflection and passivating treatment by depositing a layer of silicon nitride $Si_3N_4$ on the corresponding N layer.

The implementation of the photodetector array is thus simple and requires only a limited number of masks for all the operations involved, which results in economic manufacture of the arrays and a good production yield.

In FIG. 4, the biasing line LP and the output line LS are implemented in the form of parallel bars; as each line is common to all the cells, the bars of the biasing line are therefore connected to one another, and the bars of the output line are likewise connected to one another; this is obviously effected when diffusing the N layer and will not raise any problem of implementation for those skilled in the art. The ground line M is connected to each point 4 of the P− layer and via the latter to the P+ layer of the substrate, this P+ layer constituting the ground layer of the array; as each photodiode consists of an N/P− junction, the photodiodes are in contact with the P+ layer of the substrate through the P− layer.

The connections 2 and 3 in FIG. 4 are effected by means of an N layer, as already stated, in order to ensure continuity of the row addressing line via the connection 5 and of the ground line via the connection 2 whilst permitting crossover with the column addressing lines. In the crossover areas these connections constitute buried passages.

In FIG. 4 there is represented a row addressing line Yk, Yl above each bar of the output line LS from which it is isolated by the oxide layer, and a ground line M above each bar of the biasing line LP from which it is isolated by the oxide layer. Relative to the cell represented in FIG. 4, the layout is as follows: to the left of the bar of the output line LS represented on the left in FIG. 4 there is implanted by sliding a cell identical to that of FIG. 4; to the right of the bar of the biasing line LP represented on the right in FIG. 4 there is also implanted by sliding a cell identical to that of FIG. 4; above the column addressing line Xi and below the column addressing line Xj there is implanted a cell also obtained by simple sliding of the cell represented in FIG. 4. The row addressing line Yk is thus common to all the cells situated to the left of the bar of the output line LS comprising the line Yk and the row addressing line Yl is common to all the cells situated to the left of the bar of the output line LS comprising the line Yl. The column addressing line Xi is common to all the cells situated below it, the column addressing line Xj being common to all the cells situated below it.

The cell being implanted by horizontal and vertical sliding, the result is that in the horizontal direction a cell is contained between two sets of bars, each set of bars consisting of a bar of the output line LS and a bar of the biasing line LP situated side by side as shown in FIG. 4.

Figure 6:
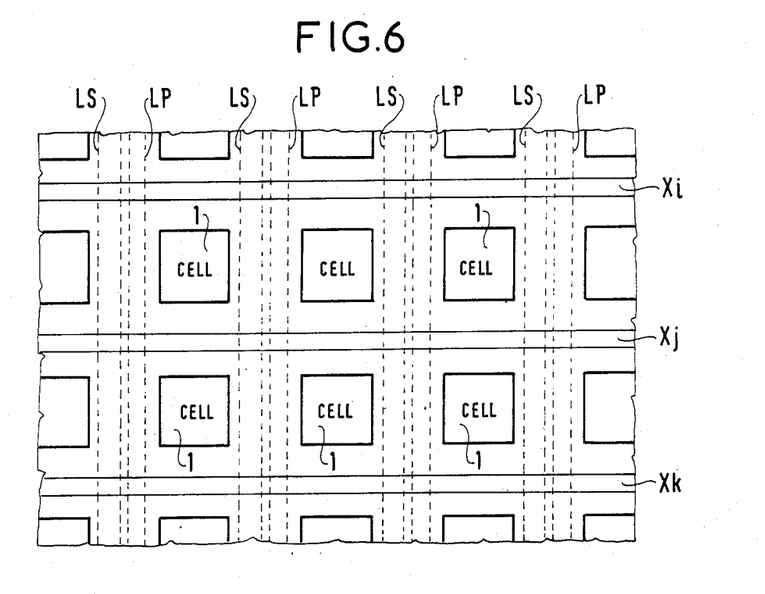
FIG. 6 is a schematic representation of part of an array corresponding to the first implementation.

FIG. 6 is a schematic representation of part of the array as in FIG. 4 and shows the implantation of the sets of bars of the biasing line LP and of the output line LS with the cells 1 contained between two sets of bars; the row addressing lines are not represented over the output line bars.

Figure 5:
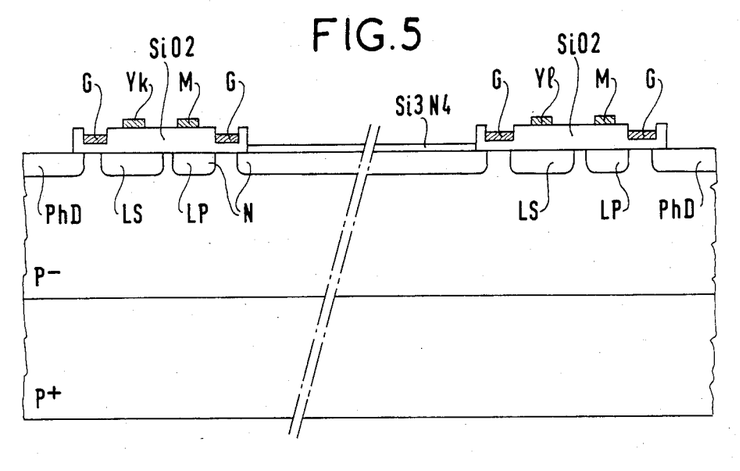
FIG. 5 is a cross-section on the line V—V in FIG. 4.

FIG. 5 is a view in cross-section on the line V—V in FIG. 4, to an enlarged scale. It shows the N type areas corresponding to the photodiodes, to the bias line LP bar and to the output line LS bar; the $SiO_2$ oxide layer above the two sets of bars each consisting of an output line bar and a biasing line bar carries the aluminum metalization corresponding to the grids G of the transistors T1 and T3, to the ground line M and to a row addressing line, Yk on the left and Yl on the right of the figure. The cell represented in FIG. 4 is that of which the electrical schematic is shown in FIG. 2, in which it is seen that the sources S of the transistors T1 and T3 are connected to the cathode of the photodiode PhD and that the drains D of these transistors are connected to the output line LS and to the biasing line LP, respectively. The cathode, the sources, the drains and the biasing line LP and the output line LS are implemented by means of an N layer in the P⁻ layer; to limit the number of connections to be made, the sources of the transistors T1 and T3 are merged with the cathode of the photodiode and the drains are merged with the output line for the transistor T1 and the biasing line LP for the transistor T3; as a result of this, the sources and drains are not geometrically delimited; it is for this reason that the sources and drains of transistors T1 and T3 are not shown in FIGS. 4 and 5; note also from FIGS. 4 and 5 that, given the implantation of the cell on the surface of the array as specified hereinabove, the biasing line LP serves as the drain for the transistors T3 and that the output line LS serves as a drain for the transistors T1. This arrangement of the sources and the drains and the cells simplifies the mask used for diffusing the N layer and the mask used for making the connections since the pattern of a cell is reproduced by sliding vertically and horizontally.

Figure 10:
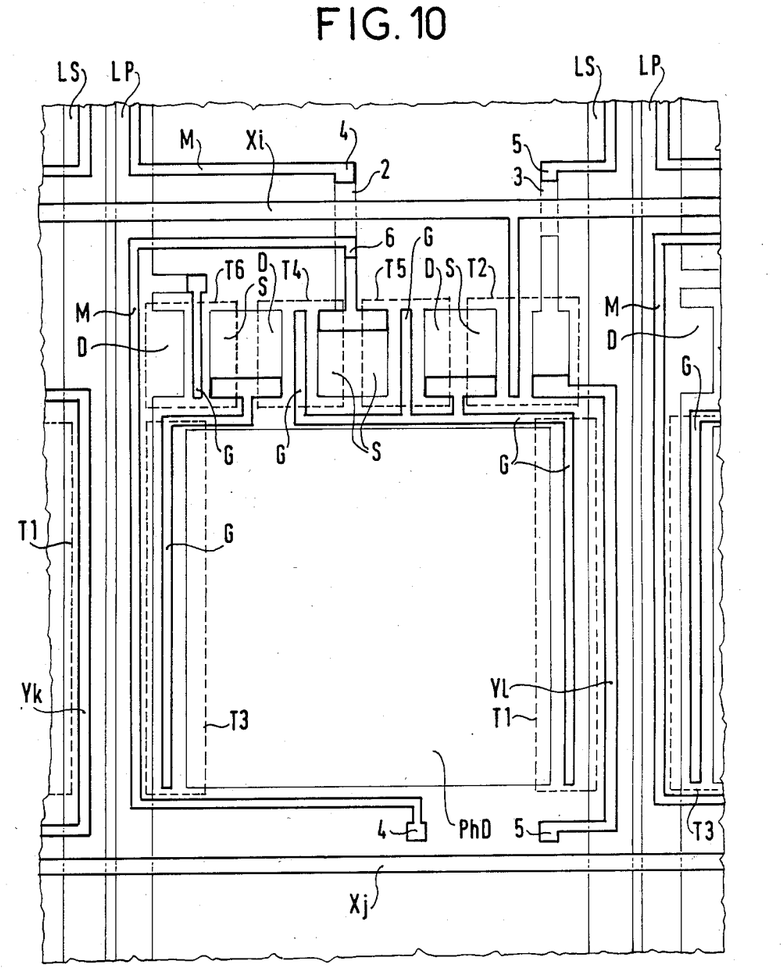
FIG. 10 represents an integrated circuit implementation of an array with a cell as in FIG. 3.

There has been described, and represented in FIGS. 4 and 5, an embodiment of the array having cells of the type shown in FIG. 2, that is to say comprising resistors R1 and R2. To implement an array with the cell of FIG. 3, the process used is the same as in the case of FIG. 4 and, as shown in FIG. 10, when diffusing the N layer N type areas corresponding to the sources and drains of the transistors T5 and T6 are formed. When making the various connections, by depositing aluminum, the source of the transistor T6 will be connected to the grid of the transistor T3 and the grid of the transistor T6 to the biasing line LP, the drain of the transistor T6 extending the biasing line LP. As for the transistor T5, its source will be connected to the ground line M and its drain and its grid to the grid of the transistor T4, itself connected to the grid of the transistor T1. The connection 2 then extends the sources of the transistors T4 and T5; the connection 2 extends the source of the transistor T5 on formation of the latter, this source constituting a single N area with the source of the transistor T4, the contact with the connection 2 being made at an intermediate point 6; similarly, the source of the transistor T2 and the drain of the transistor T5 constitute a single N area and the drain of the transistor T4 and the source of the transistor T6 constitute a single N area.

Connections internal to each cell are also implemented by depositing aluminum. These internal connections comprise: a connection linking the grid electrode of the transistor T1 to the source of the transistor T2 to the drain of the transistor T5, to the grid electrode of the transistor T4, and to the grid electrode of the transistor T5, a connection linking the grid electrode of the transistor T3 to the source of the transistor T6 and to the drain of the transistor T4, and a connection linking the sources of the transistors T4 and T5 to the intermediate point 6.

An anti-reflection and passivating treatment is then applied to the photodiodes by depositing a layer of silicon nitride $Si_3N_4$ on the corresponding N layer.

The implementation of the photodetector array is thus simple and requires only the same number of masks, for all the operations involved, as does a cell in accordance with FIG. 2, which results in economic manufacture of the arrays and a good production yield.

Figure 7:
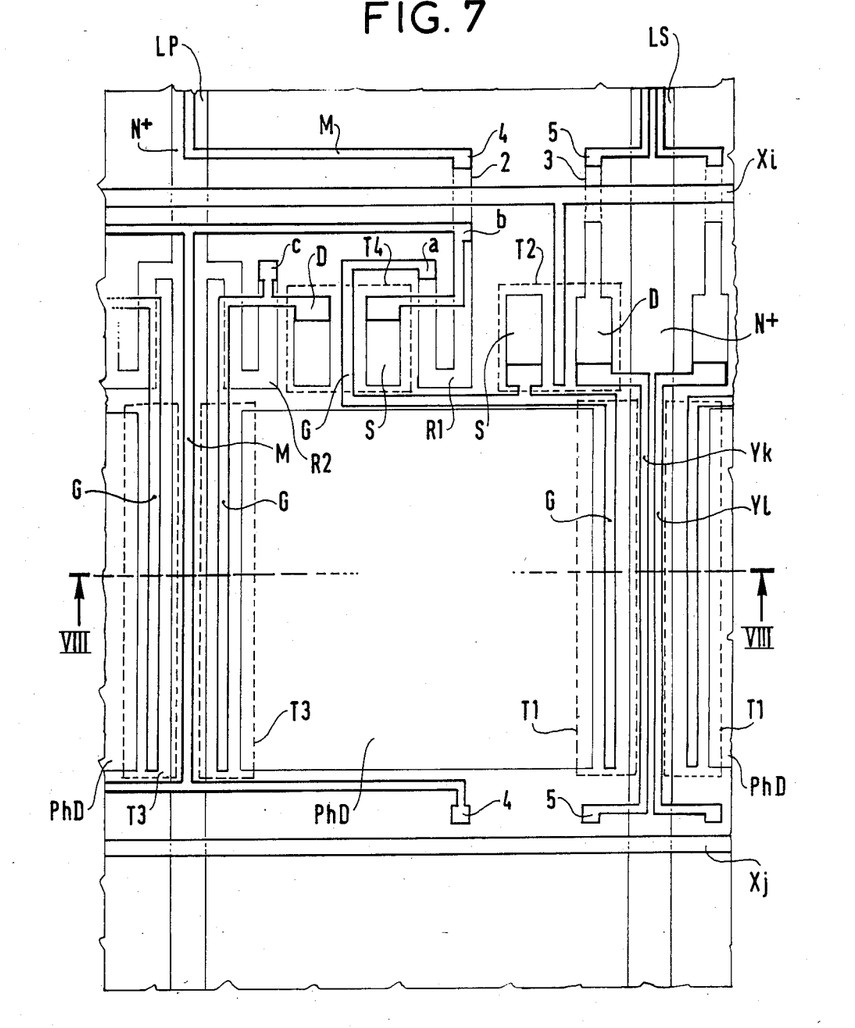
FIG. 7 represents a second integrated circuit implementation of an array with a cell as in FIG. 2.

In FIG. 7, which represents a second implementation of an array with the cell from FIG. 2, the biasing line LP and the output line LS are implemented in the form of alternating parallel bars; as each line is common to all the cells, the bars of the biasing line are therefore connected to one another and the bars of the output line are likewise connected to one another; this is obviously effected when diffusing the N layer and will not raise any problem of implementation for those skilled in the art. The ground line M is connected at each point 4 to the P⁻ layer and via the latter to the P⁺ layer of the substrate, this P⁺ layer constituting the ground layer of the array; as each photodiode consists of an N/P⁻ junction, the photodiodes are in contact with the P⁺ layer of the substrate through the P⁻ layer. The cell is the same as in the array illustrated by FIG. 4, and is implemented identically.

The connections 2 and 3 in FIG. 7 are effected by means of an N layer, as already stated, in order to ensure continuity of the row addressing line via the connection 5 and of the ground line via the connection 2 whilst permitting crossover with the column addressing lines. In the crossover areas these connections constitute buried passages.

In FIG. 7 are shown two row addressing lines Yk and Yl over the bar of the output line LS from which they are isolated by the oxide layer and a ground line M over the biasing line LP from which it is isolated by the oxide layer; this is justified by the implantation of the cells on the integrated circuit. Relative to the cell represented in FIG. 7, the implantation is as follows: to the right of the bar of the output line LS there is implanted a cell symmetrical to that of FIG. 7 relative to this bar; to the left of the bar of the biasing line LP there is implanted a cell symmetrical to that of FIG. 7 relative to this bar; above the column addressing line Xi and below the column addressing line Xj there is implanted a cell obtained by simply sliding the cell represented in FIG. 7. The row addressing line Yk is thus common to all the cells situated to the left of the bar of the output line LS and the row addressing line Yl is common to all the cells situated to the right of said bar. The column addressing line Xi is common to all the cells below it and the column addressing line Xj is common to all the cells below it.

Figure 9:
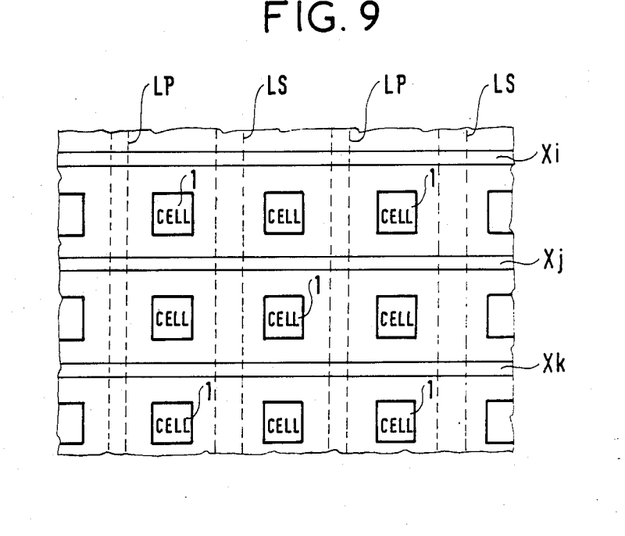
FIG. 9 is a schematic representation of part of an array corresponding to the second implementation.

FIG. 9 is a schematic representation of part of the array as in FIG. 7, and shows the alternation of the bars of the biasing line LP and the bars of the output line LS, with the cells 1 contained between a bar of the output line and a bar of the biasing line; the row addressing lines are not shown over the output line bars.

Figure 8:
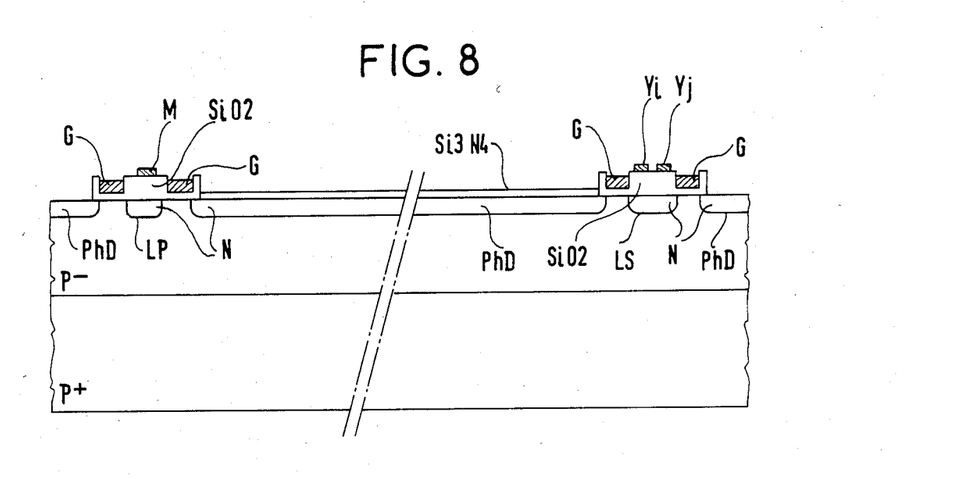
FIG. 8 is a cross-section on the line VIII—VIII in FIG. 7.

FIG. 8 is a view in cross-section on the line VIII—VIII in FIG. 7, to an enlarged scale. It shows the N type areas corresponding to the photodiodes, to the bar of the biasing line LT and to the bar of the output line LS; the $SiO_2$ oxide layer above the bars carries the aluminum metalization corresponding above the biasing line LP to the grids G of the transistors T3 and to the ground line M and above the output line LS to the grids of the transistors T1 and to the row addressing lines Yl and Yk. The cell represented in FIG. 7 is that of which the electrical schematic is shown in FIG. 2, in which it is seen that the sources S of the transistors T1 and T3 are connected to the cathode of the photodiode PhD and that the drains D of these transistors are connected to the output line and to the biasing line LP, respectively. The cathode, the sources, the drains, the biasing line LP and the output line LS are implemented by means of an N layer in the P− layer; to limit the number of connections to be made, the sources of the transistors T1 and T3 are merged with the cathode of the photodiode and the drains are merged with the output line for the transistor T1 and the biasing line LP for the transistor T3; as a result of this the sources and drains are not geometrically delimited; it is for this reason that the sources and drains of the transistors T1 and T3 are not shown in FIG. 7 or FIG. 8; note also in FIGS. 7 and 8 that, given the implantation of the cell on the surface of the array as described hereinabove, the biasing line LP serves as the drain for the transistors T3 situated on either side of this line and that the output line LS serves as the drain for the transistors T1 situated on either side of this line. This arrangement of the sources and the drains and the cells necessitates one mask for diffusing the N layer and one mask for implementing the connections, differing from those of FIG. 4; it provides for reducing the overall dimensions through alternating the bars of the output line LS and the biasing line LP.

There has been described, and represented in FIGS. 7 and 8, an embodiment of the array having cells of the type shown in FIG. 2, that is to say comprising resistors R1 and R2. To implement an array with the cell of FIG. 3, in the case of an array having alternating bars, the transistors T5 and T6 are implemented as in the case illustrated by FIG. 10. In the various embodiments of the array illustrated by FIGS. 4, 7 and 10, a cell is always implanted between an output line LS bar and a biasing line LP bar.

To adjust the threshold voltage of the transistors T1 and T4 the P− layer below the grids of these transistors may be overdoped; this may be achieved on implementing the thin oxide layer by overdoping the latter with boron, for example; the regions of the P− layer corresponding to the grids of the transistors T1 to T4 may also be overdoped by ion implantation through a specific mask.

The photodetector array in accordance with the invention provides for the reception of as many programs as there are cells and the selection by the subscriber of one of the received programs; the term "program" is to be understood as encompassing a television signal, data in digital or analog form, a speech signal or, more generally, any form of analog or digital signal.

It will be understood that various changes in the details, materials and arrangements of parts, which have been herein described and illustrated in order to explain the nature of the invention, may be made by those skilled in the art within the principle and scope of the invention as expressed in the appended claims.

It is claimed:

1. Matrix array of addressable photodetectors comprising:
   an output line common to each of said photodetectors,
   a biasing line common to each of said photodetectors,
   row addressing lines,
   column addressing lines,
   a ground connection to each photodetector, and
   a respective addressing circuit associated with each photodetector each addressing circuit comprising first means for connecting said each photodetector to said output line, second means for connecting said each photodetector to said biasing line, third means connected to said biasing line and to ground for controlling said second means, and fourth means connected to one of said row addressing lines and to one of said column addressing lines and to ground for controlling said first and third means, wherein said first, third and fourth means are turned off and said second means are turned on in the absence of signals on said row and column addressing lines, and said first, third and fourth means are turned on and said second means are turned off when signals are applied to said row and column addressing lines to select said each photodetector associated with said addressing circuit.

2. Photodetector array according to claim 1, wherein:
   the first means of the addressing circuit consists of a transistor having a grid,
   the second means consists of a transistor having a grid,
   the third means consists of a transistor in series with a resistor connected to the biasing line, a point common to the transistor and to the resistor being connected to said grid of the transistor of the second means, and
   the fourth means consists of a transistor in series with a resistor connected to ground, the transistor of said fourth means being connected to the row addressing line and having a grid connected to the column addressing line, and a point common to the resistor and transistor of said fourth means being connected to the grid of the transistor of the first means.

3. Photodetector array according to claim 1, wherein:

the first means of the addressing circuit consists of a transistor having a grid, the second means consists of a transistor having a grid, the third means consists of a first transistor and a second transistor in series, the second transistor being connected to the biasing line and having a grid also connected to the biasing line, a point common to the first and second transistors being connected to said grid of the transistor of the second means, and the fourth means consists of a first transistor and a second transistor in series, the second transistor of said fourth means being connected to ground and having a grid connected to the first transistor of said fourth means, the first transistor of said fourth means being connected to the row addressing line and having a grid connected to the column addressing line, a point common to the first and second transistors of said fourth means being connected to a grid of the transistor of the first means.

4. Photodetector array according to claim 2, comprising:

a low-resistivity P+ substrate wafer, a high-resistivity P− type layer formed over one entire surface of said P+ type substrate, N type areas in the high-resistivity layer to constitute, with the high-resistivity P− layer, junctions corresponding to the photodetectors, to the sources and the drains of the transistors of the third and fourth means, said N type areas in conjunction with said high-resistivity layer also constituting the resistors, one end of the resistor of the fourth means being in contact with the biasing line, first connections each extending the resistor of the fourth means, second connections each extending the drain of the transistor of the fourth means, the output line and the biasing line in the form of bars, an output line bar and a biasing line bar being disposed side by side and constituting a set of bars, the array comprising a plurality of sets of parallel bars and each photodetector and the transistors and the resistors of the third and fourth means of its addressing circuit, and the first and the second connections to its addressing circuit being disposed between two sets of bars, the sources and drains of the transistors of the first means being respectively common to the photodetectors and to the output line, the sources and drains of the transistors of the second means being respectively common to the photodetectors and to the biasing line, the surface of the wafer, with the exception of the photodetectors and of part of the sources and drains of the transistors of the third and fourth means, being covered with a thin oxide layer (SiO$_2$), with contact openings in the oxide layer at one end of each of the second connections opposite the drain which it extends, at each end of the resistors of the third means and at each of the resistors of the fourth means, to gain access to the N layer, and at one end of each of the first connections opposite the resistor that it extends, to gain access to the high-resistivity P− layer, a metal which is a good conductor of electricity deposited on said array and forming the source and drain electrodes of the transistors of the third and fourth means contacting the N and P− layers in the contact openings, and, on the oxide, the grid electrodes of the transistors and an interconnection network consisting of the column addressing lines and the connections of said column addressing lines with the grid electrodes of the transistors of the fourth means, the row addressing lines over the output line bars and the connections of the row addressing lines with the drains of the transistors of the fourth means and the ends of the second connections, a ground line above the bars of the biasing line and the connections of said ground line with the resistors of the fourth means and the ends of the first connections, and connections internal to each addressing circuit, an anti-reflection coating on the surface of the photodetectors, and said array being constituted of cells derived from one another by vertical and horizontal sliding, each cell comprising a photodetector and its addressing circuit.

5. Photodetector array according to claim 3, comprising;

a low-resistivity P+ type substrate wafer, a high-resistivity P− layer on an entire surface of said low-resistivity layer, N type areas in said high-resistivity layer to constitute, with the high-resistivity P− layer, junctions corresponding to the photodetectors, to the sources and the drains of the transistors of the third and fourth means, the drain of the second transistor of the third means being in contact with the biasing line, said N-type areas in conjunction with said high-resistivity layer forming first connections each extending the source of the second transistor of the fourth means, second connections each extending the drain of the first transistor of the fourth means, the output line and the biasing line in the form of bars, an output line bar and a biasing line bar being disposed side by side and constituting a set of bars, the array comprising a plurality of sets of parallel bars, and each photodetector and the transistors of the third and fourth means of its addressing circuit and the first and the second connections to its addressing circuit being situated between two sets of bars, the sources and drains of the transistors of the first means being respectively common to the photodetectors and to the output line, the sources and drains of the transistors of the second means being respectively common to the photodetectors and to the biasing line, the surface of the wafer, with the exception of the photodetectors and of part of the sources and drains of the transistors of the third and fourth means, being covered with a thin oxide layer (SiO$_2$), contact openings in the oxide layer at one end of each of the second connections opposite the drain which it extends and at an intermediate point on each of the first connections, to gain access to the N layer, and at one end of each of the first connections opposite the source which it extends, to gain access to the high-resistivity P− layer, a metal which is a good conductor of electricity forming the source and drain electrodes of the transistors of the third and fourth means contacting with the N and P− layers in the contact openings, and, on the oxide, the grid electrodes of the transistors and an interconnection network consisting of the column addressing lines and the connections of the column addressing lines with the grid electrodes of the first transistors of the fourth means, the row addressing lines over the output line bars and the connections of the row addressing lines with the drains of the first transistors of the fourth means and the ends of the second connections, a ground line above the biasing line and the connections of the ground line with the sources of the second transistors of the fourth means, the intermediate point and the ends of the first connections, and connections internal to each addressing circuit, an anti-reflection coating on the surface of the photodetectors, and the array consists of cells derived from one another by vertical and horizontal sliding, each cell comprising a photodetector and its addressing circuit.

6. Photodetector array according to claim 2, comprising:

a low-resistivity P+ substrate type wafer, a high-resistivity P− type layer on an entire surface of said low-resistivity layer, N type areas in said high resistivity layer to constitute, with the high-resistivity P− layer, junctions corresponding to the photodetectors, to the sources and the drains of the transistors of the third and fourth means, said N-type areas also constituting with said high-resistivity layer the resistors, one end of the resistors of the fourth means being in contact with the biasing line, first connections each extending the resistor of the fourth means, second connections each extending the drain of the transistor of the fourth means, the output line and the biasing line in the form of alternating bars, the array comprising a plurality of alternating bars and each photodetector and the transistors and the resistors of the third and fourth means, and the first and second connections to its addressing circuit being situated between two alternating bars, the sources and drains of the transistors of the first means being respectively common to the photodetectors and to the output line, the sources and drains of the transistors of the second means being respectively common to the photodetectors and to the biasing line, the surface of the wafer, with the exception of the photodetectors and part of the sources and drains of the transistors of the third and fourth means being covered with a thin oxide layer (SiO$_2$), contact openings in the oxide layer at one end of each of the second connections opposite the drain which it extends, at each end of the resistors of the third means and at each end of the resistors of the fourth means, to gain access to the N layer, and at one end of each of the first connections opposite the resistor that it extends, to gain access to the high-resistivity P− layer, a metal which is a good conductor of electricity deposited on said array to form the source and drain electrodes of the transistors of the third and fourth means contacting with the N and P− layers in the contact openings, and, on the oxide, the grid electrodes of the transistors and an interconnection network consisting of the column addressing lines and the connections of the column addressing lines with the grid electrodes of the transistors of the fourth means, the row addressing lines over the output line bars, each bar comprising two row addressing lines each assigned to a separate addressing circuit situated on a respective side of said bar, and the connections of the row addressing lines with the drains of the transistors of the fourth means and the ends of the second connections, a ground line above the bars of the biasing line and the connections of the ground line with the end of the resistors of the fourth means and the ends of the first connections, and connections internal to each addressing circuit, an anti-reflection coating on the surface of the photodetectors, and the array being constituted of cells which between two alternating bars are derived from one another vertically by sliding relative to an output line bar and horizontally by symmetry relative to a biasing line bar, each cell comprising a photodetector and its addressing circuit.

7. A photodetector array according to claim 3, comprising:

a low-resistivity P+ substrate wafer, a high-resistivity P− type layer on an entire surface of said low-resistivity layer, N-type areas in the high-resistivity layer to constitute, with the high-resistivity P− layer, junctions corresponding to the photodetectors, to the sources and the drains of the transistors of the third and fourth means, the drain of the second transistor of the third means being in contact with the biasing line, said N-type areas also constituting with the high-resistivity layer first connections each extending the source of the second transistor of the fourth means, second connections each extending the drain of the first transistor of the fourth means, the output line and the biasing line in the form of alternating bars, the array comprising a plurality of alternating bars and each photodetector and the transistors of the third and fourth means of its addressing circuit and the first and second connections to its addressing circuit being disposed between two alternating bars, the sources and drains of the transistors of the first means being respectively common to the photodetectors and to the output line, the sources and drains of the transistors of the second means being respectively common to the photodetectors and to the biasing line, the surface of the wafer, with the exception of the photodetectors and part of the sources and the drains of the transistors of the third and fourth means, being covered with a thin oxide layer (SiO$_2$), contact openings in the oxide layer at one end of each of the second connections opposite the drain which it extends and at an intermediate point of each of the first connections, to gain access to the N layer, and at one end of each of the first connections opposite the source which it extends, to gain access to the high-resistivity P− layer, a metal which is deposited on said array to form the source and drain electrodes of the transistors of the third and fourth means contacting with the N and P− layers in the contact openings, and, on the oxide, the grid electrodes of the transistors and an interconnection network consisting of the column addressing lines and the connections of the column addressing lines with the grid electrodes of the first transistors of the fourth means, the row addressing lines over the output line bars, each bar comprising two row addressing lines each assigned to a respective different addressing circuit situated on opposite sides of each bar, and the connections of the row addressing lines with the drains of the first transistors of the fourth means and the ends of the second connections, a ground line above the biasing line and the connections of the ground line with the sources of the second transistors of the fourth means, the intermediate point and the ends of the first connections, and connections internal to each addressing circuit, an anti-reflection coating on the surface of the photodetectors, and the array being constituted of cells which between two alternating bars are derived from one another vertically by sliding relative to an output line bar and horizontally by symmetry relative to a biasing line bar, each cell comprising a photodetector and its addressing circuit.

* * * * *